United States Patent
Bachowski et al.

[11] Patent Number: 5,252,175
[45] Date of Patent: Oct. 12, 1993

[54] CAPILLARY PRESSURE RELIEF FOR MAGNETIC KRYOPOULOS GROWTH OF SEMICONDUCTOR CRYSTALS

[75] Inventors: Steven Bachowski, Woburn; Brian S. Ahern, Boxboro; Robert M. Hilton, Chelmsford; Joseph A. Adamski, Framingham, all of Mass.

[73] Assignee: The United States of America as represented by the Secretary of the Air Force, Washington, D.C.

[21] Appl. No.: 546,063

[22] Filed: Jun. 29, 1990

[51] Int. Cl.$^5$ ............................................. C30B 11/02
[52] U.S. Cl. ................................. 156/620.2; 156/616.1; 156/616.2; 156/616.3; 156/616.4; 156/616.41; 156/DIG. 70
[58] Field of Search ............... 156/616.1, 616.2, 616.3, 156/616.4, 616.41, 620.2, DIG. 70

[56] References Cited

U.S. PATENT DOCUMENTS

| | | | |
|---|---|---|---|
| 2,892,739 | 6/1959 | Rusher | 422/249 |
| 4,561,486 | 12/1985 | Maeda et al. | 156/616 R |
| 4,609,425 | 9/1986 | Mateika et al. | 156/DIG. 83 |
| 4,609,530 | 2/1986 | Morioka et al. | 420/555 |
| 4,684,515 | 8/1987 | Kawasaki et al. | 423/495 |
| 4,840,699 | 6/1989 | Khattak et al. | 156/616.4 |

FOREIGN PATENT DOCUMENTS 61-261298 11/1986 Japan.
1-61392 3/1989 Japan.

OTHER PUBLICATIONS

Ahern et al., Magnetically Stablized Kyropoulos Growth of Undoped InP, Materials Letters, vol. 8, No. 11, 12, Nov. 89, pp. 486-488.
Liquid Encapsulated Czochralski Growth of GaAs; Weiner et al; Bell Telephone Laboratories, Inc.; J. Electrochem Soc.; vol. 118, No. 2 (Feb.) 1971.
Solar-Grade Silicon by Directional Solidification in Carbon Crucibles; Ciszek et al; IBM J. Res. Dev.; vol. 23; No. 3 (May 1979).
"Methods of Growing Crystal Under Pressure" 9.2.2 and 9.2.3; Fischer; Crystal Growth; 2nd ed. vol. 16, pp. 362-364.

Primary Examiner—Robert Kunemund
Assistant Examiner—Felisa Carrett
Attorney, Agent, or Firm—Stanton E. Coller; Donald J. Singer

[57] ABSTRACT

In the liquid encapsulated Kyropoulos process, the crystal is allowed to grow to the limits of the crucible and remain under the encapsulant fluid. In order to relieve the melt pressure between the growing crystal and the crucible, at least one capillary pressure relief hole is placed in the crucible which allows some of the melt to leak therefrom to relieve pressure.

11 Claims, 2 Drawing Sheets

CAPILLARY PRESSURE RELIEF FOR MAGNETIC KRYOPOULOS GROWTH OF SEMICONDUCTOR CRYSTALS

STATEMENT OF GOVERNMENT INTEREST

The invention described herein may be manufactured and used by or for the Government for governmental purposes without the payment of any royalty thereon.

BACKGROUND OF THE INVENTION

The present invention relates to semiconductor crystal growth, and, in particular, relates to magnetic Kyropoulos growth of semiconductor crystals.

In the field of semiconductor crystal growth of III-V compounds, the liquid encapsulated Czochralski (LEC) process and the liquid encapsulated Kyropoulos (LEK) process have been used to grow crystals. The addition of a magnetic field has also been used to improve the quality of the crystals.

In the LEC process, a seed being rotated is placed in contact with the melt which is covered by a layer of fluid such as $B_2O_3$ to prevent the escape of volatile compounds therefrom. As the crystal grows on the seed, the crystal is pulled from the melt. The process is normally carried out in a high pressure chamber. U.S. Pat. No. 4,684,515 is incorporated by reference. During the growth process, the crystal is subjected to high temperature gradients which results in a high dislocation density in the crystal.

In the LEK process being similar to the LEC process, the crystal formed on the seed is allowed to cool and solidify under the liquid encapsulation and then removed by breaking the crucible, for example, if quartz is used or by using ultrasonic water bath if pyrolytic boron nitride is used. This provides a more homogeneous temperature distribution and less thermal strain. In the past this technique has resulted in crystals having a larger diameter than length. Although the dislocation density has been lower using this technique, the amount of useable crystal has been less. U.S. Pat. No. 4,609,503 is incorporated by reference.

In particular, indium phosphide provides several important advantages for optoelectronic technology and millimeter microwave integrated circuits (MMIC) devices. This direct band gap material serves as a substrate which is lattice matched to ternary and quarternary compounds that emit light in the 1.3 to 1.55 micron spectral region, the region of lowest attentuation of silica-based optical fibers. In addition, the high mobility of charge carriers in InP and in lattice matched InP compounds, combined with its good thermal conductivity, make it an attractive material for high power, high frequency electronic devices.

Substrates play a major role in determining the quality of the electronic devices. To date, the full potential of InP substrates has been limited by crystal imperfections and inhomogeneous dopant distribution. The propagation of dislocations through epitaxial layers and dopant migration are a major problem for device fabrication.

The liquid encapsulated Czochralski (LEC) process is currently the dominant method for the growth of InP boules. However, because of convection currents in the melt and a large thermal gradient near the crystal-melt interface, LEC growth of III-V materials tends to result in high dislocation densities.

The large thermal gradients can be reduced by modifying the hot zone and by slowing the pull rate, but this has classically led to poor diameter control and for InP loss of phosphorus from the emerging boule. The vertical gradient freeze (VGF) method can be used to surmount these problems, but in-situ synthesis prior to crystal growth, which results in higher purity InP is difficult.

Even with these attempts to improve crystal quality, crystals still have the "W" shaped dislocation density pattern across the crystal and have high dislocation densities also.

SUMMARY OF THE INVENTION

The present invention is a process to produce very high quality III-V compound semiconductor crystals using the liquid encapsulated Kyropoulos (LEK) process. The apparatus used in this process is conventional except that the melt crucible has a capillary pressure relief hole at the bottom to relieve the pressure build-up as the solidifying interface of the crystal progresses toward the bottom of the crucible. The crystal is not removed during the growth process. After cooling, the crystal is removed from the crucible for use.

The object of the present invention is to provide a process and apparatus that can be used for all material growths which exhibit a positive thermal expansion on solidification.

Another object of the present invention is to provide a process and apparatus for producing very high quality III-V compound semiconductor crystals using the LEK process.

Another object of the present invention is to provide a process and apparatus for producing semiconductor crystals using a magnetic field in the LEK process.

Another object of the present invention is to provide a process and apparatus for producing semiconductor crystals using the LEK process wherein the dislocation density is substantially flat across the crystal diameter.

Another object of the present invention is to provide a process and apparatus for producing semiconductor crystals using the MLEK process having a substantially flat dislocation density across the crystal and a dislocation density of about $10^2$ per $cm^2$.

Another object of the present invention is to provide a process and apparatus for producing semiconductor crystals using the LEK process wherein these crystals will be used in the next generation of advanced electronic and optoelectronic devices.

These and many other objects and advantages of the present invention will be readily apparent to one skilled in the pertinent art from the following detailed description of a preferred embodiment of the invention and the related drawings.

DESCRIPTION OF THE PREFERRED EMBODIMENT

The present invention is a process and apparatus for the growth of very high quality III-V compound semiconductor crystals such as indium phosphide (InP), gallium arsenide (GaAs), and cadmium telluride (CdTe), for example, in the liquid encapsulated Kyropoulos process. See Ahern et al., Magnetically Stabilized Kyropoulos Growth of Undoped InP, Materials Letters, Volume 8, Number 11,12, November 1989, pages 486 to 488 which is incorporated by reference. Although the invention is particularly described as to InP, other crystals may be grown using the present invention if the crystal exhibit a positive thermal expansion on solidification.

The liquid encapsulated Kyropoulos (LEK) process combines many of the attractive features of LEC and VGF growth. Like LEC, LEK is top-seeded, so in-situ synthesis followed by crystal growth is practical. As in VGF, thermal gradients at the crystal-melt interface are not large because the LEK crystal is never pulled through the encapsulant.

Figure 1:
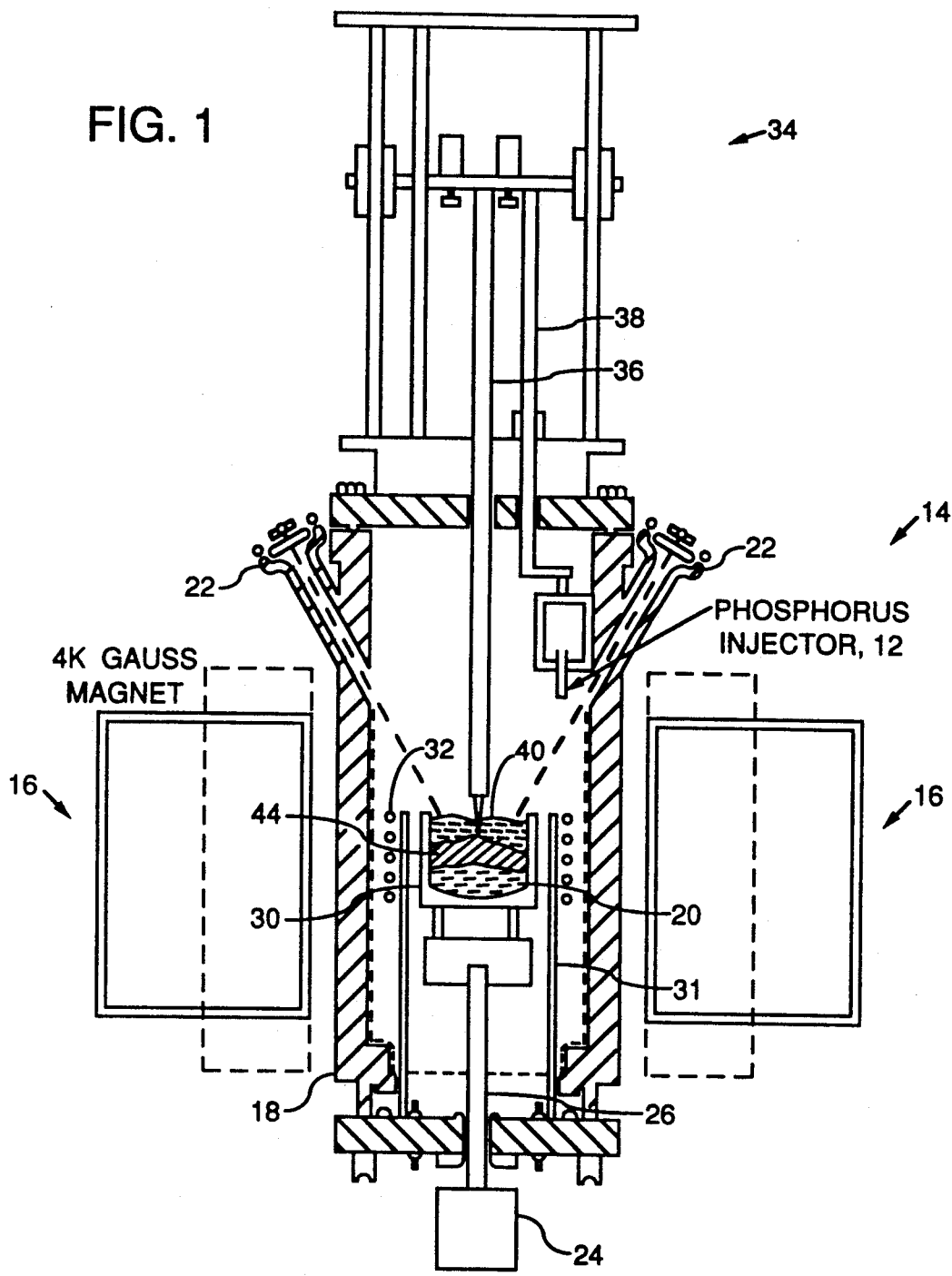
FIG. 1 illustrates by cross-section the crystal growth furnace using the present invention.

Referring to FIG. 1, a crystal growth furnace 14 is shown. An electro-magnet 16 is placed about the furnace 14 and produces an axial field in the growth area. Additional parts of the furnace 14 are as follows: furnace walls 18; viewing ports 22; a phosphorus injector 12; a lower drive 24 for rotation of a pedestal 26; a crucible 28; a heat susceptor 30; radio frequency (rf) coils 32 for heating; an upper drive 34 for rotating a seed shaft 36, translating the seed shaft 36, and for rotating an injector shaft 38. All power lines, water lines, gas lines, pressure pumps, data and control lines are considered conventional and not shown.

Figure 4:
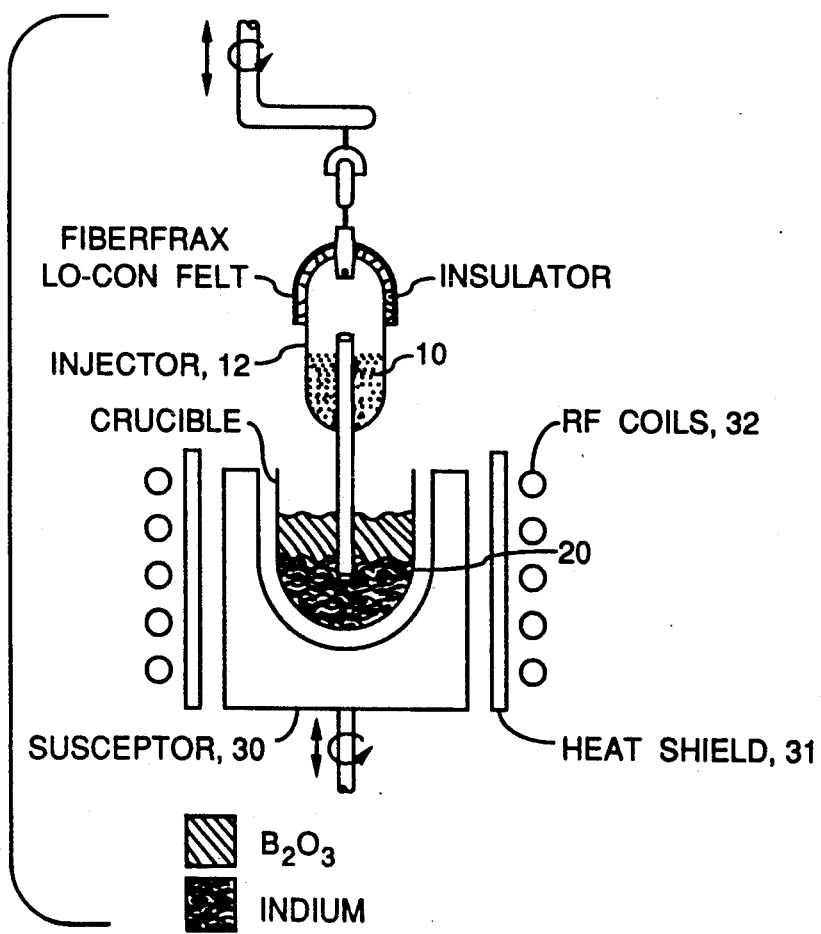
FIG. 4 illustrates the means for injecting phosphorus into the indium melt, if required, by the present invention.

Undoped indium phosphide crystals were grown by the Czochralski and the Kyropoulos processes with and without axial magnetic field stabilization. Referring to FIG. 4, InP charges were prepared by injecting phosphorus 10 into an indium melt 20. Typically 110 grams of red phosphorus 10 is placed into a quartz injector 12. The phosphorus 10 is then injected into 300 grams of indium 20. For LEC and magnetic LEK (MLEK), in-situ growth was accomplished. Thus, the InP charge was not isolated before growth.

Figure 2:
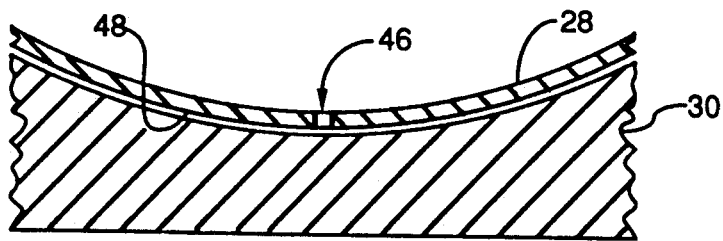
FIG. 2 illustrates by partial cross-section a wall of a crucible of the present invention.

A pressure of 550 psi of nitrogen over boron oxide ($B_2O_3$) 40 was maintained during crystal growth to compensate for the high vapor pressure of the phosphorus in the melt 20. A uniform axial 2 kG magnetic field was employed to promote melt stability. A (111) seed was used in all cases; the crucible 28 was 70 mm in diameter and 80 mm deep and is shown partially in FIG. 2 with the susceptor 30 thereabout.

The LEK and the associated magnetic LEK used the same furnace configuration as the LEC process. However, LEK differs from LEC in that a crystal 44 is crowned off in LEK growth to the sides of the crucible 28 and then directionally cooled by zoning. The crown is kept as flat as possible so the crystal 44 is not removed from the encapsulant 40. Keeping the melt interface below the encapsulant 40 results in a lower thermal gradient than in LEC and also minimizes the loss of the phosphorus; the diameter and length are controlled by the crucible size.

For the purpose of comparison the same environment was maintained for both the LEC and the LEK growth. Thus, for these processes the pull rate was 12 mm/h with counter-rotation at 4 rpm for the seed and crucible 28. For LEK and MLEK, the seeded crystal and susceptor 30 was slowly moved out of the hot zone at a rate of 12 mm/h with concentric rotation of 4 rpm. 1 cm of dry boron oxide was used as the encapsulant 40.

30 mil wafers were sliced and mechanically polished using 15 micron diamond polish. The resulting wafers were chemically polished using a 1 percent bromine/methanol solution and cleaned in trichloroethane, toluene and acetone. The surface is then pretreated with Karo's acid for 5 minutes before etching. Hubers etch was applied for 2 minutes on the (111) face of the crystals. After etching, dislocation densities were determined by taking a series of photographs across the face of the wafer using Normarski interference contrast microscopy.

The first LEK crystals produced had much larger dislocation densities than LEC crystals of the same size. Surmising that this result was due to pressure build-up from the large positive expansion of InP on solidification, a capillary pressure relief (CPR) hole 46 was machined in the bottom 48 of the crucible 28 to relieve the pressure build-up. See FIG. 2.

Additional capillary pressure relief holes 46 could be placed in the crucible 28, for example, in the walls and bottom. This would depend on the material being processed.

Figure 3:
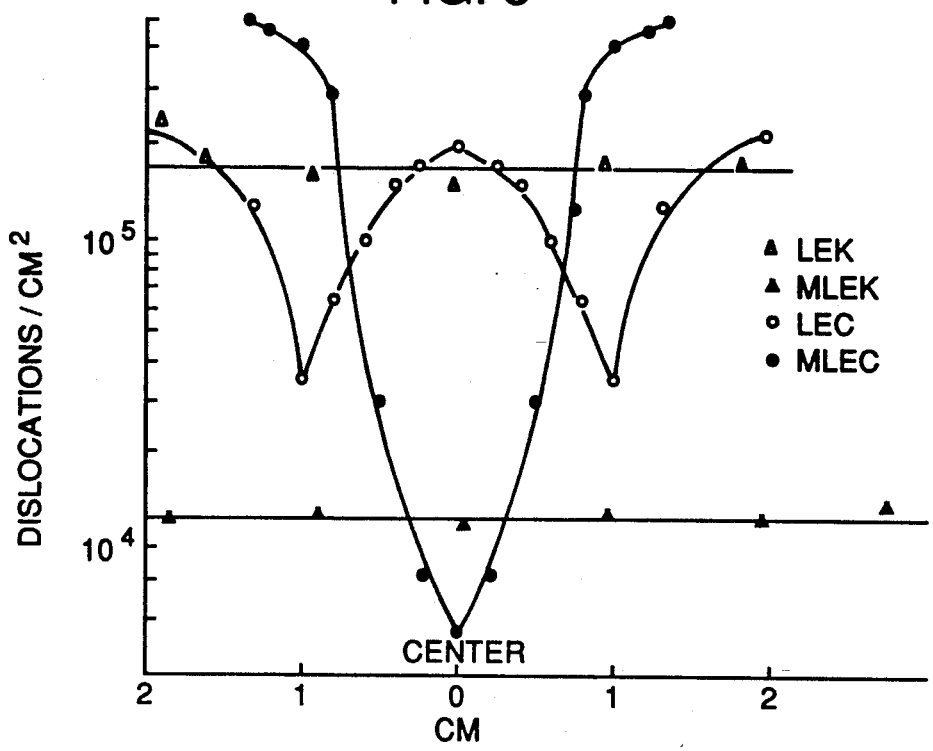
FIG. 3 is a graph comparing crystals prepared by various processes and the present invention.

FIG. 3 compares the dislocation profiles for (111) wafers from the middle of boules for LEC, MLEC, LEK and MLEK. The LEC wafers show the expected "W" pattern; the dislocation density is comparable to densities in commercial wafers. The 70 mm LEK wafers have dislocation densities comparable to those of LEC crystals but the distribution for LEK is uniform across the wafer. Application of an axial magnetic field lowered the dislocation density by an order of magnitude, preserving the uniform distribution.

Additional samples produced by the MLEK process had dislocation densities approaching $10^2$ with a uniform distribution.

The capillary pressure relief hole 46 was of a diameter such that when methanol was placed in the crucible 28 a small amount of wetting occurred on the bottom 48 of the crucible 28. Only when under crystal growth pressure did the melt 20 leak out. A container can be placed thereunder to hold the discharged fluid.

Clearly, many modifications and variations of the present invention are possible in light of the above teachings and it is therefore understood, that within the inventive scope of the inventive concept, the invention may be practiced otherwise than specifically claimed.

What is claimed is:

1. A process for growing single crystals using the liquid encapsulated Kyropoulos process, the improvement in said process comprising:
   allowing a single crystal to grow from a melt under a liquid encapsulant, the crystal growing to contact a crucible;
   allowing a liquid pressure of the melt under the growing crystal to be relieved;
   allowing the crystal to solidify and cool in the crucible; and
   removing the crystal from the crucible.

2. A process as defined in claim 1 wherein said single crystal is composed of III-V chemical elements.

3. A process as defined in claim 2 wherein said single crystal is selected from the group comprising indium phosphide, gallium arsenide, and cadmium telluride.

4. A process as defined in claim 1 wherein said liquid encapsulant is boron oxide.

5. A process as defined in claim 1 wherein the crystal growth occurs as a result of the vertical gradient freeze process.

6. A process as defined in claim 1 further including the step of applying a magnetic field to the growing single crystal.

7. A process as defined in claim 1 wherein said liquid pressure is relieved by means of capillary pressure relief.

8. A process as defined in claim 7 wherein said capillary pressure relief results from at least one capillary hole in the crucible.

9. A process as defined in claim 8 further including the step of applying a magnetic field to the growing single crystal.

10. A process as defined in claim 1 wherein the grown crystal has a dislocation density which is substantially flat across the crystal diameter.

11. A process as defined in claim 10 wherein said density is about $10^2$ per $cm^2$.

* * * * *